United States Patent
Chen et al.

(10) Patent No.: US 8,314,644 B2
(45) Date of Patent: Nov. 20, 2012

(54) CLOCK GENERATOR, PULSE GENERATOR UTILIZING THE CLOCK GENERATOR, AND METHODS THEREOF

(75) Inventors: Hong-Ching Chen, Kaohsiung (TW); Chang-Po Ma, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/354,315

(22) Filed: Jan. 19, 2012

(65) Prior Publication Data

US 2012/0112812 A1    May 10, 2012

Related U.S. Application Data

(62) Division of application No. 13/091,154, filed on Apr. 21, 2011, now Pat. No. 8,174,300, which is a division of application No. 12/336,539, filed on Dec. 17, 2008, now Pat. No. 8,013,654.

(51) Int. Cl.
*H03H 11/26* (2006.01)
(52) U.S. Cl. .................................. 327/261; 327/299
(58) Field of Classification Search .................. None
See application file for complete search history.

(56) References Cited

U.S. PATENT DOCUMENTS

| | | | |
|---|---|---|---|
| 5,550,499 | A | 8/1996 | Eitrheim |
| 6,069,506 | A | 5/2000 | Miller, Jr. |
| 6,111,925 | A | 8/2000 | Chi |
| 6,175,605 | B1 | 1/2001 | Chi |
| 7,042,267 | B1 | 5/2006 | Pasqualini |
| 7,327,180 | B2 | 2/2008 | Yamaguchi |
| 7,733,129 | B2 * | 6/2010 | Chang .............................. 326/93 |
| 8,013,654 | B1 | 9/2011 | Chen |
| 2007/0008025 | A1 | 1/2007 | Tseng |
| 2007/0210833 | A1 * | 9/2007 | Hamdan et al. ................... 326/93 |
| 2008/0046771 | A1 | 2/2008 | Hsu |
| 2008/0178055 | A1 * | 7/2008 | Nakamura ..................... 714/735 |

OTHER PUBLICATIONS

Ping-Ying Wang, ISSCC2007: RTL-Based Clock-Recovery Architecture with All-Digital Duty-Cycle Correction, Feb. 11-15, 2007.

* cited by examiner

*Primary Examiner* — Cassandra Cox
(74) *Attorney, Agent, or Firm* — Winston Hsu; Scott Margo

(57) ABSTRACT

Disclosed is a clock generator for generating a target clock signal, which includes: a control circuit, receiving a reference clock signal, and for generating a clock enable signal and a delay selecting signal according to the reference clock signal; a delay module, coupled to the control circuit, for delaying the reference clock signal according to the delay selecting signal to generate a delayed reference clock signal; and a clock gating unit, coupled to the delay module and the control circuit, for receiving the delayed reference clock signal and the clock enable signal, and for passing the delayed reference clock signal according to the clock enable signal, to generate the target clock signal.

6 Claims, 19 Drawing Sheets

CLOCK GENERATOR, PULSE GENERATOR UTILIZING THE CLOCK GENERATOR, AND METHODS THEREOF

CROSS REFERENCE TO RELATED APPLICATIONS

This application is a divisional application of U.S. applications Ser. No. 13/091,154 filed on Apr. 21, 2011, which is a divisional application of U.S. application Ser. No. 12/336,539 filed on Dec. 17, 2008 and incorporated herein by reference.

BACKGROUND OF THE INVENTION

The present invention relates to a clock generator, a pulse generator utilizing the clock generator, and methods thereof, and particularly relates to a clock generator utilizing a delay module with suitable input signal and providing accurate delay amounts to generate an output signal, a pulse generator utilizing the clock generator, and methods thereof.

Conventionally, a delay module (e.g. a delay line) serves to delay an input clock signal in order to generate a desired clock signal, and many circuits or systems are developed utilizing this concept. However, the conventional circuits or systems have several disadvantages as described below.

FIG. 1 is a schematic diagram illustrating a related art frequency dividing operation. As known by persons skilled in the art, a frequency dividing operation is utilized to lower a frequency of a clock signal, and the resultant frequency divided clock signal is utilized as an input signal for the above mentioned delay module. For example, a frequency dividing operation is performed on the original clock signal CLK to generate a frequency divided clock signal Divided_CLK having a frequency half that of the clock signal CLK. Then the frequency divided clock signal Divided_CLK is utilized as an input signal for the above mentioned delay module. However, since the frequency divided clock signal Divided_CLK has a frequency only half or less of the original clock signal CLK, a very high frequency of the original clock signal CLK is needed if the delay module requires a high frequency divided clock signal Divided_CLK.

FIG. 2 is a schematic diagram illustrating a related art skew problem. As shown in FIG. 2, the above-mentioned delay module includes a plurality of delay units, and at least one of the delay selecting signals SEL1, SEL0 is utilized to select whether or not the input signal IN is delayed. However, the input signal IN and the delay selecting signals SEL1, SEL0 should accurately match, otherwise the output signal OUT will have errors. As shown in FIG. 2, a rising edge should be located at the location A but is located at a wrong location B, and therefore an unnecessary signal part Q appears in the output signal OUT. Such a problem is called "Skew" and will become more serious if the input signal IN and the delay selecting signals SEL1, SEL0 have high frequency. In addition, due to this skew problem, the circuits of the delay module must be well designed and the interval between two input signals cannot be too short or the skew problem will become serious.

SUMMARY OF THE INVENTION

Therefore, one objective of the present invention is to provide the delay module with a suitable input signal.

Another objective of the present invention is to provide a self alignment mechanism such that the skew problem can be solved.

One embodiment of the present application discloses a clock generator for generating a target clock signal, which comprises: a control circuit, receiving a reference clock signal, and for generating a clock enable signal and a delay selecting signal according to the reference clock signal; a delay module, coupled to the control circuit, for delaying the reference clock signal according to the delay selecting signal to generate a delayed reference clock signal; and a clock gating unit, coupled to the delay module and the control circuit, for receiving the delayed reference clock signal and the clock enable signal, and for passing the delayed reference clock signal according to the clock enable signal, to generate the target clock signal.

Another embodiment of the present invention discloses a clock generator for generating a target clock signal, which comprises: a control circuit, receiving a reference clock signal, and for generating a delay selecting signal according to the reference clock signal; and a delay module, coupled to the control circuit, for delaying the reference clock signal according to the delay selecting signal to generate the target clock signal, wherein the delay module includes: a first delay block, for delaying the reference clock signal to generate a first delayed reference clock signal; a first register, for registering the delay selecting signal according to the first delayed reference clock signal to generate a registered delay selecting signal; and a second delay block, for delaying the first delayed reference clock signal to generate a second delayed reference clock signal according to the registered delay selecting signal.

Still another embodiment of the present application discloses a pulse generator, which comprises: a control circuit, receiving a reference clock signal and a data signal, and for generating a clock enable signal and a delay selecting signal according to the reference clock signal, wherein the control circuit generates the clock enable signal when a state of the data signal changes; a clock gating unit, coupled to the control circuit, for receiving the reference clock signal and the clock enable signal, and for passing the reference clock signal according to the clock enable signal, to generate a clock gated signal; a delay module, coupled to the clock gating unit, for delaying the clock gated signal according to the delay selecting signal to generate a target clock signal; and a pulse signal generating unit, coupled to the delay module, for generating a pulse signal according to the target clock signal, wherein a width of the pulse signal is determined by the delay selecting signal.

Another embodiment of the present application discloses a clock generating method for generating a target clock signal, which comprises: generating a clock enable signal and a delay selecting signal according to the reference clock signal; delaying the reference clock signal according to the delay selecting signal to generate a delayed reference clock signal; blocking the delayed reference clock signal; and passing the delayed reference clock signal according to the clock enable signal, to generate the target clock signal.

Another embodiment of the present application discloses a clock generating method for generating a target clock signal, which comprises: generating a delay selecting signal according to a reference clock signal; delaying the reference clock signal to generate a first delayed reference clock signal; registering the delay selecting signal according to the first delayed reference clock signal to generate a registered delay selecting signal; and delaying the first delayed reference clock signal to generate a second delayed reference clock signal according to the registered delay selecting signal.

Another embodiment of the present application discloses a pulse generating method, comprising: generating a clock enable signal according to a reference clock signal when a state of a data signal changes; generating a delay selecting signal according to the reference clock signal; blocking the reference clock signal; passing the reference clock signal according to the clock enable signal, to generate a clock gated signal; delaying the clock gated signal according to the delay selecting signal to generate a target clock signal; and generating a pulse signal according to the target clock signal, wherein a width of the pulse signal is determined by the delay selecting signal.

Related methods can be acquired according to the above-mentioned embodiments, and related descriptions are thus omitted here for brevity.

According to the above-mentioned embodiments, a correct clock signal edge can be provided without frequency-dividing the clock signal, therefore a high frequency clock signal is no longer needed. Additionally, the delay selecting signal can be self-aligned, thus the problem of skew can be improved.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 3A:
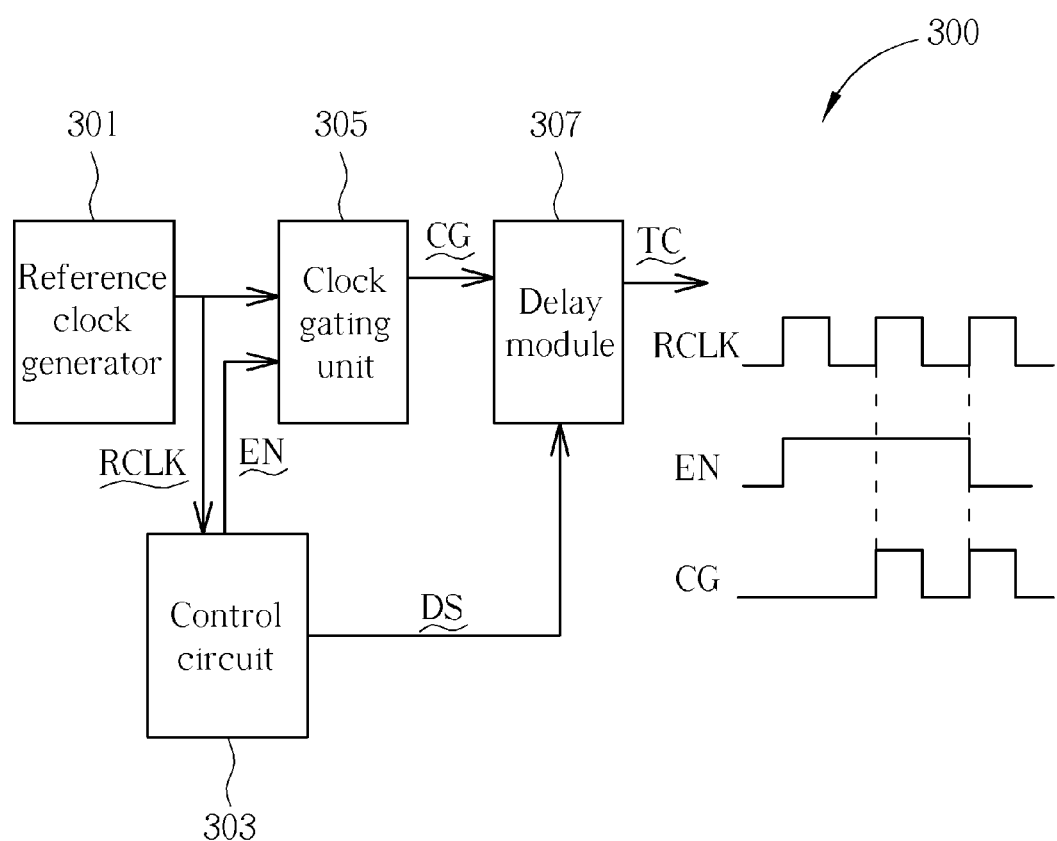
FIG. 3a is a schematic diagram illustrating a clock generator according to a first embodiment of the present invention.

FIG. 3a is a schematic diagram illustrating a clock generator 300 according to a first embodiment of the present invention. The clock generator 300 may include: a control circuit 303, a clock gating circuit 305 and a delay module 307. A reference clock generator 301 may also be included in the clock generator 300. It is not necessary to have the reference clock generator, though the reference clock generators are included in the embodiments illustrated herein. The reference clock could be generated by any other components inside or outside the clock generator and pulse generator according to this invention. The reference clock generator 301 serves to generate a reference clock signal RCLK. The control circuit 303 receives the reference clock signal RCLK, and generates a clock enable signal EN and a delay selecting signal DS according to the reference clock signal RCLK. The clock gating unit 305 receives the reference clock RCLK and the clock enable signal EN, and passes the reference clock signal RCLK according to the clock enable signal EN, to generate a clock gated signal CG. The delay module 307 serves to delay the clock gated signal CG according to the delay selecting signal DS to generate the target clock signal TC (i.e. a desired clock signal).

Figure 1:
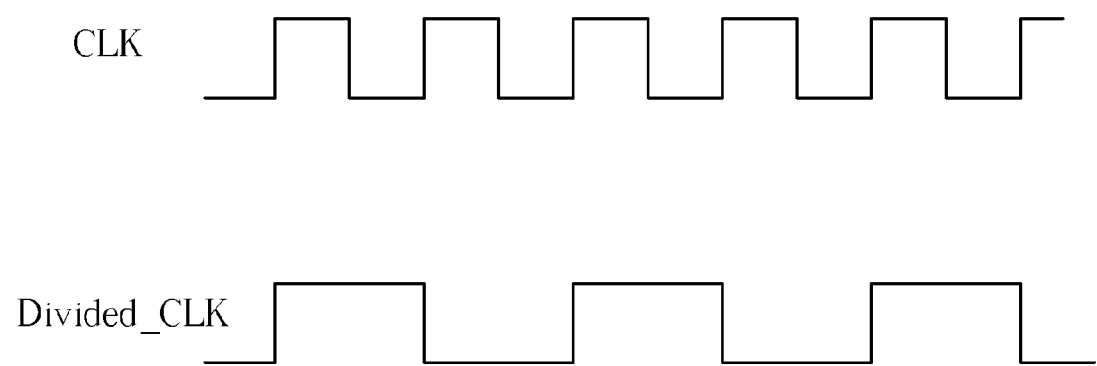
FIG. 1 is a schematic diagram illustrating a related art frequency dividing operation.
Figure 3B:
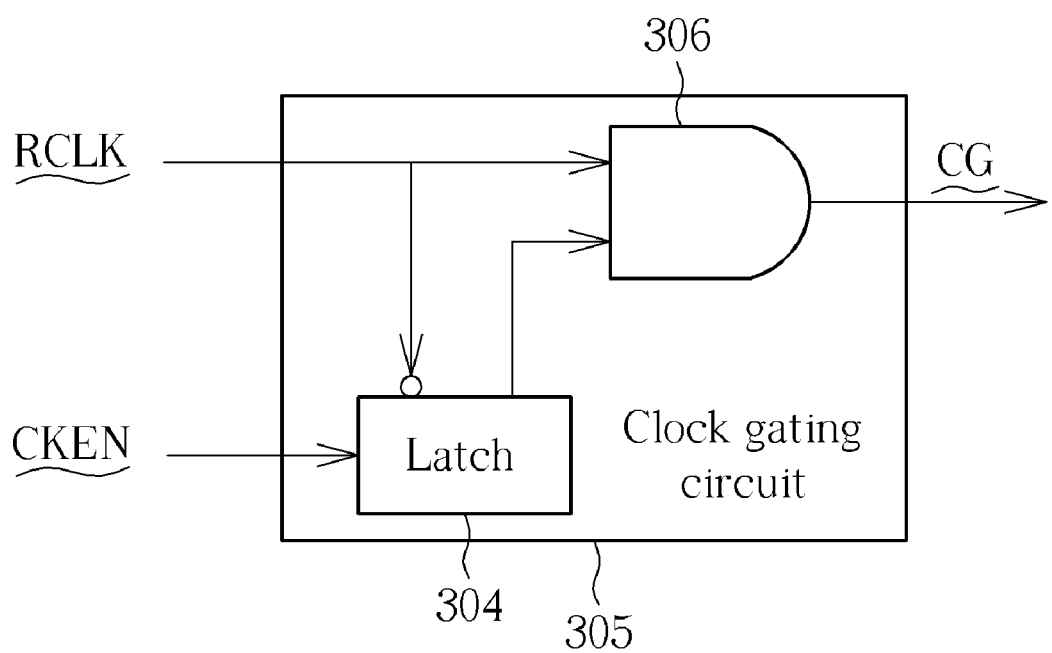
FIG. 3b is a block diagram illustrating a detailed structure of the clock gating unit according to an embodiment of the present invention.

Please refer to a signal diagram also illustrated in FIG. 3a. As shown in FIG. 3a, the clock gating unit 305 generates a passing window according to the clock enable signal EN, such that the clock gating unit 305 can pass the reference clock signal RCLK to generate the clock gating signal CG accordingly. FIG. 3b is a block diagram illustrating an example of the detailed structure of the clock gating unit 305 according to an embodiment of the present invention. As shown in FIG. 3b, the clock gating unit 305 includes a latch 304 and an AND gate 306. The clock enable signal EN is latched by the latch 304 and is triggered by a negative edge of the reference clock RCLK, and then the output of the latch 304 and the reference clock signal RCLK are processed by the AND gate 306 to generate the clock gating signal CG. It should be noted that the structure shown in FIG. 3b is only an example and does not mean to limit the scope of the present invention. Via the embodiment shown in FIG. 3b, a desired clock edge for a clock signal inputted to the delay module 307 can be obtained without performing a frequency dividing operation on the reference clock signal, thus the problem shown in FIG. 1 can be improved.

Figure 3C:
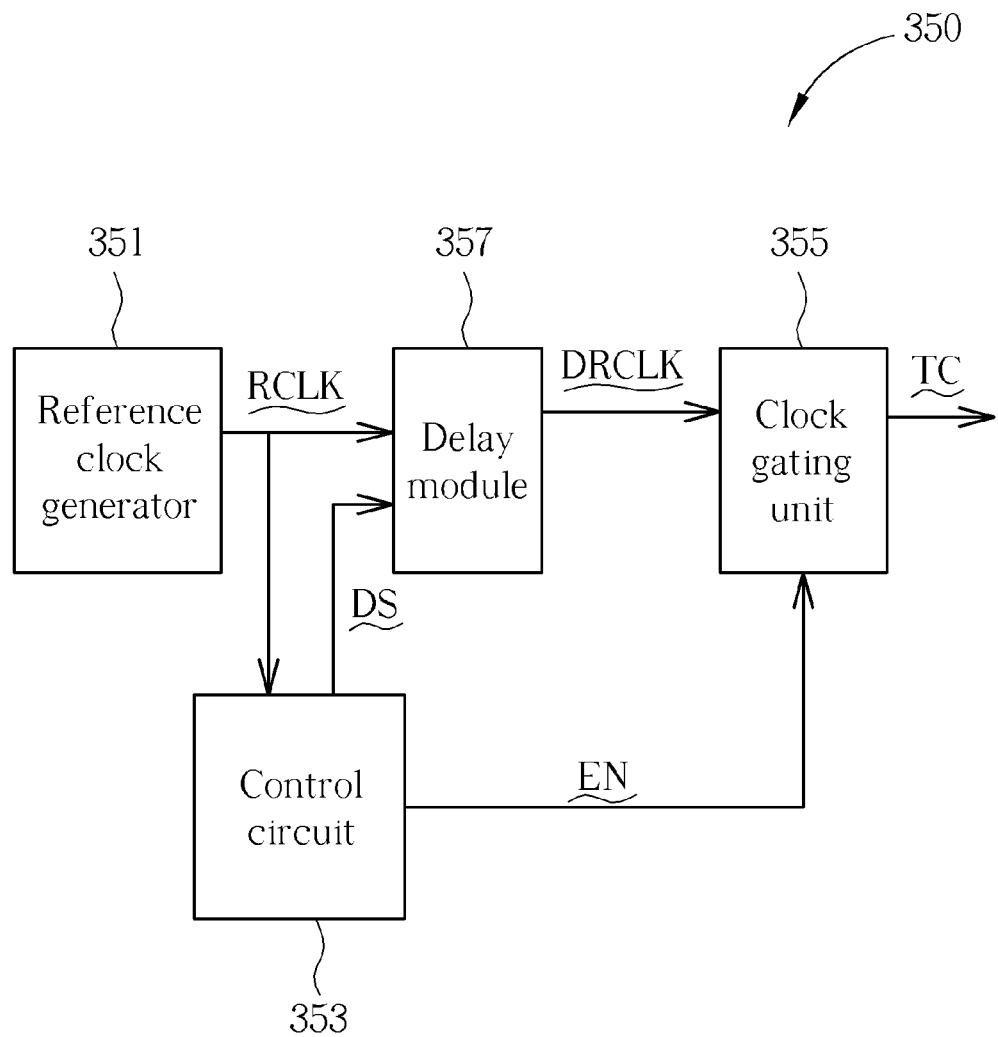
FIG. 3c is a schematic diagram illustrating a clock generator according to a second embodiment of the present invention.

FIG. 3c is a schematic diagram illustrating a clock generator 350 according to a second embodiment of the present invention. Compared with the embodiment shown in FIG. 3a, the clock generator 350 also includes a control circuit 353, a clock gating circuit 355 and a delay module 357. A reference clock generator 351 may also be included. However, the clock gating circuit 355 is a following stage of the delay module 357 instead of a front stage of the delay module 357. Therefore, the embodiments shown in FIGS. 3a and 3c have some different operations. In the embodiment shown in FIG. 3c, the delay module 357 receives the reference clock RCLK and the delay selecting signal DS, and delays the reference clock RCLK according to the delay selecting signal DS. Then, the clock gating unit 355 receives the delayed reference clock DRCLK and the clock enable signal EN, and passes the delayed reference clock signal DRCLK according to the clock enable signal EN, to generate the target clock signal TC.

Figure 2:
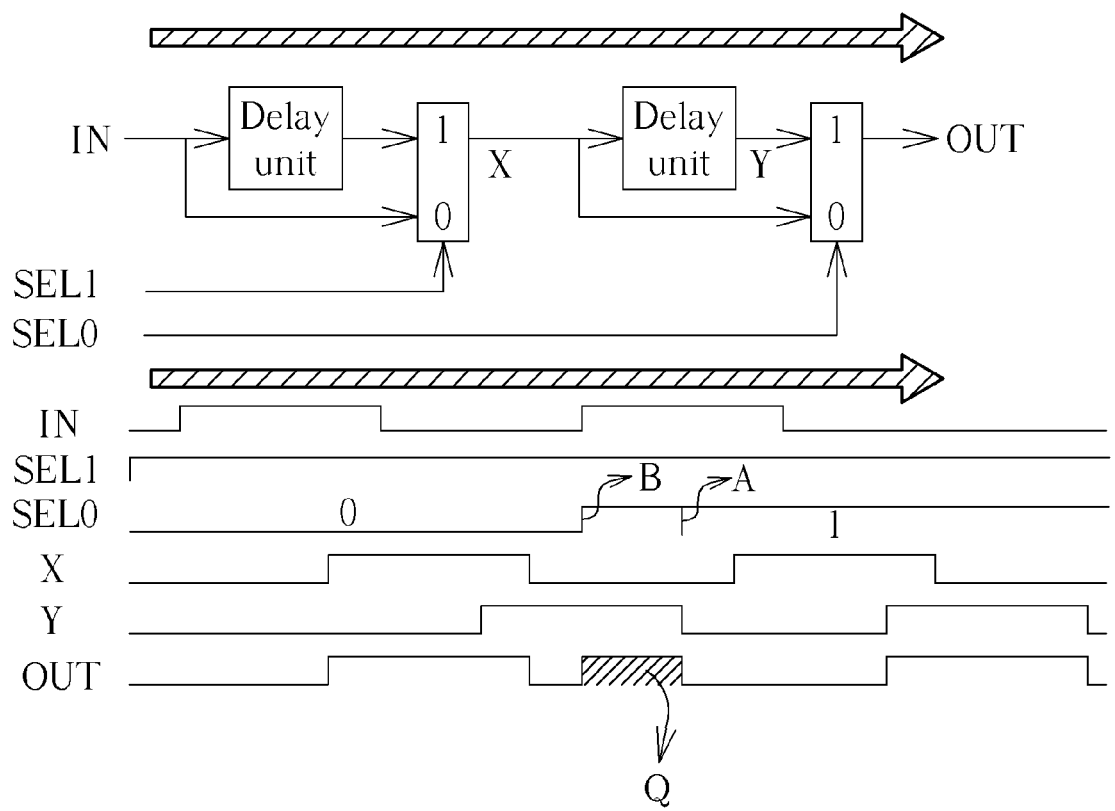
FIG. 2 is a schematic diagram illustrating a related art skew problem.
Figure 4:
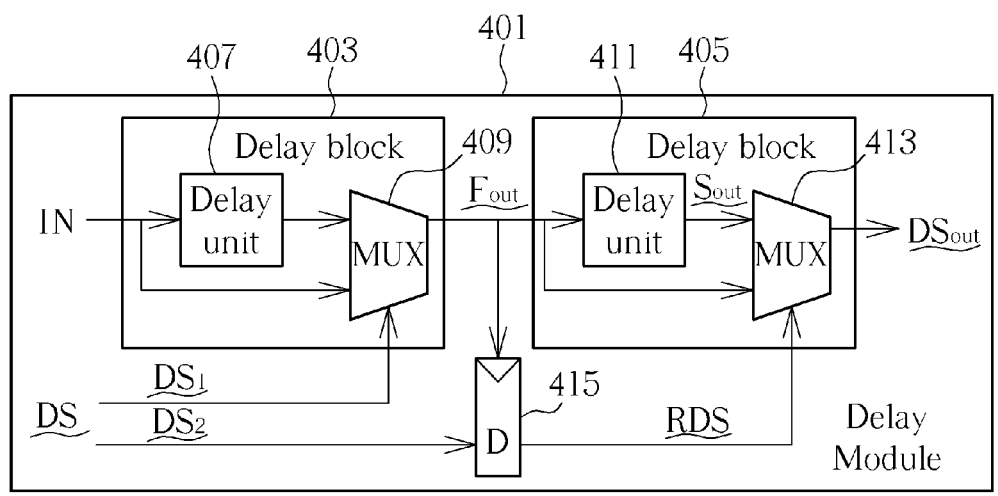
FIG. 4 is a block diagram illustrating part of the delay clock generator according to a third embodiment of the present invention.
Figure 4:
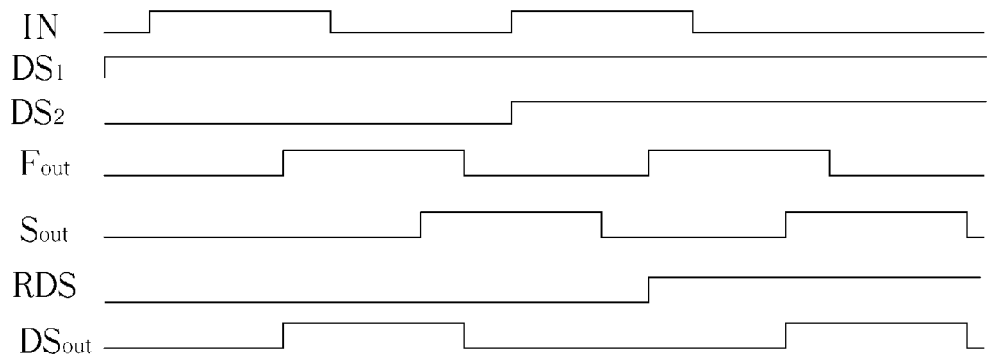

FIG. 4 is a block diagram illustrating a delay module 401 according to a third embodiment of the present invention which can solve the skew problem illustrated in FIG. 2. As shown in FIG. 4, the delay module 401 can include a plurality of delay blocks 403, 405, which can include delay units 407, 411, respectively, and selectors 409, 413. Additionally, the delay module 401 can further include a register 415, which is a D flip flop in the embodiment shown in FIG. 4. However, other components capable of registering, such as a latch, may also act as the register 415. The delay selecting signal $DS_2$ is registered by the register 415 and outputted as a registered delay selecting signal RDS according to the first output signal $F_{out}$, which is generated by processing the input signal IN via the delay block 403. Next, the delay block 405 processes the first output signal $F_{out}$ to generate an output signal $DS_{out}$ according to the registered delay selecting signal RDS. It should be noted that the delay selecting signal DS further includes delay signals $DS_1$ and $DS_2$ in this embodiment, for selecting whether the signals inputted to the delay block 407 and the delay block 405 should be delayed or not. Therefore, the delay selecting signal DS can be a signal set including a plurality of signals, corresponding to the detailed structures of the delay module.

Please refer to the signal diagram also disclosed in FIG. 4. The first output signal $F_{out}$ is outputted according to the first delay selecting signal $DS_1$, and the registered delay selecting signal RDS is generated via registering the second delay selecting signal $DS_2$ (e.g. phase shifting the second delay selecting signal $DS_2$). The second output signal $S_{out}$ is outputted by the delay unit 411 according to the first output signal $F_{out}$. Finally, the output signal DSout is selected from the first output signal $F_{out}$ or the second output signal $S_{out}$ according to the registered delay selecting signal RDS. In this embodiment, the registered delay selecting signal RDS have edges at correct locations, thus the problem illustrated in FIG. 2 can be solved. Such a mechanism can be regarded as a "de-skew" mechanism.

Figure 5:
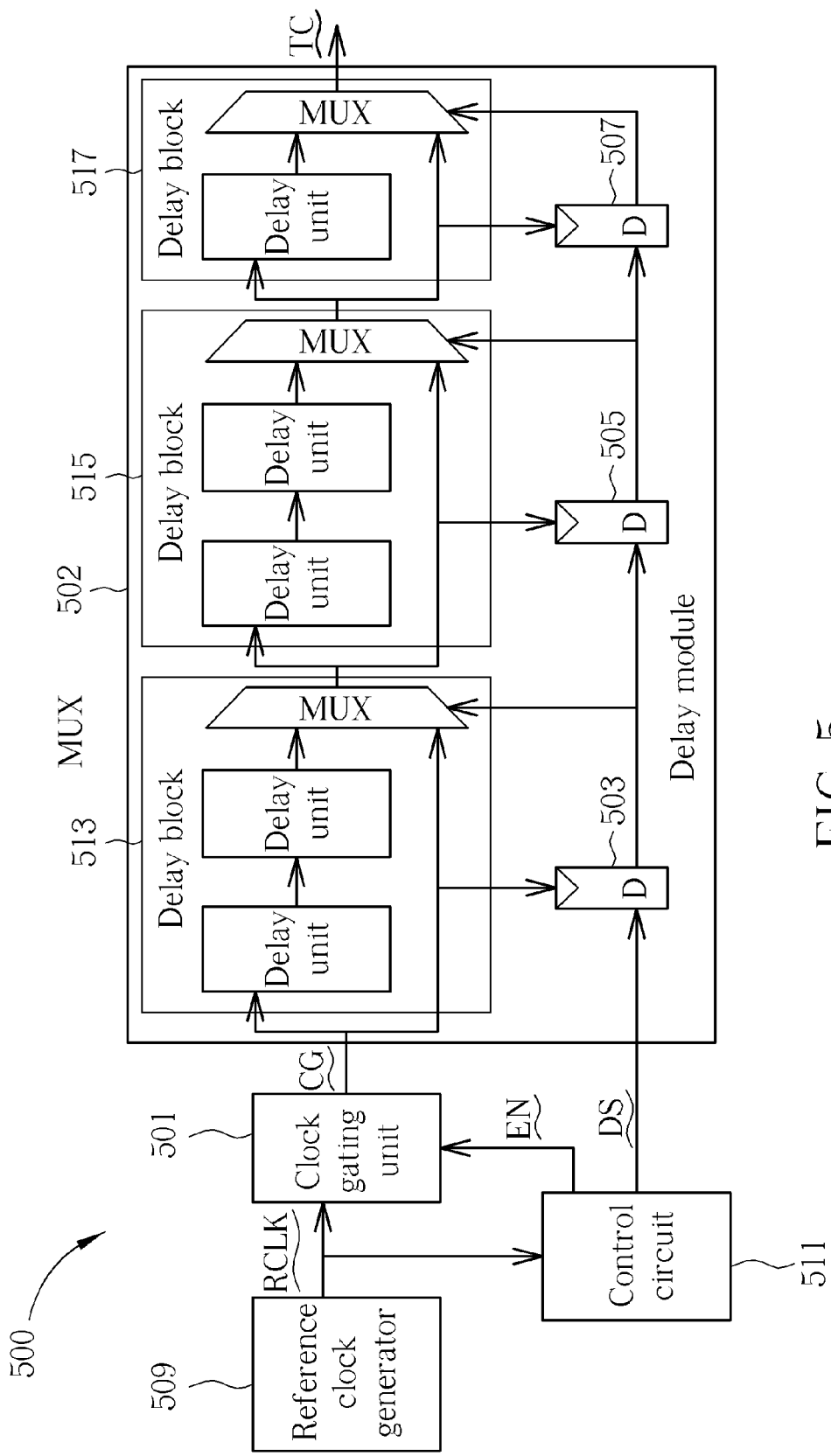
FIG. 5 is a block diagram illustrating a clock generator according to a fourth embodiment of the present invention, which merges the concepts shown in FIG. 3 and FIG. 4.

The following embodiments are the application of the embodiments shown in FIGS. 3 and 4. Please jointly refer to these figures to clearly understand the concept of the present invention. FIG. 5 is a block diagram illustrating a clock generator 500 according to a fourth embodiment of the present invention, which merges the concepts shown in FIG. 3 and FIG. 4. As shown in FIG. 5, the clock generator 500 has the clock gating unit 501, and the delay module 502 includes a plurality of delay blocks 513, 515, 517, and a plurality of registers 503, 505, 507. As illustrated above, the clock gating unit 501 serves to pass the reference clock RCLK for providing correct edges according to the enable signal EN. The registers 503, 505 and 507 register the delay selection signal DS according to the clock gated signal or the output signals from delay blocks 513 and 515, such that the delay units of the delay module 502 can be well-selected. It should be noted that the number of the delay blocks and the number of delay units in each delay block is not limited to that shown in the embodiment of FIG. 5.

Figure 6:
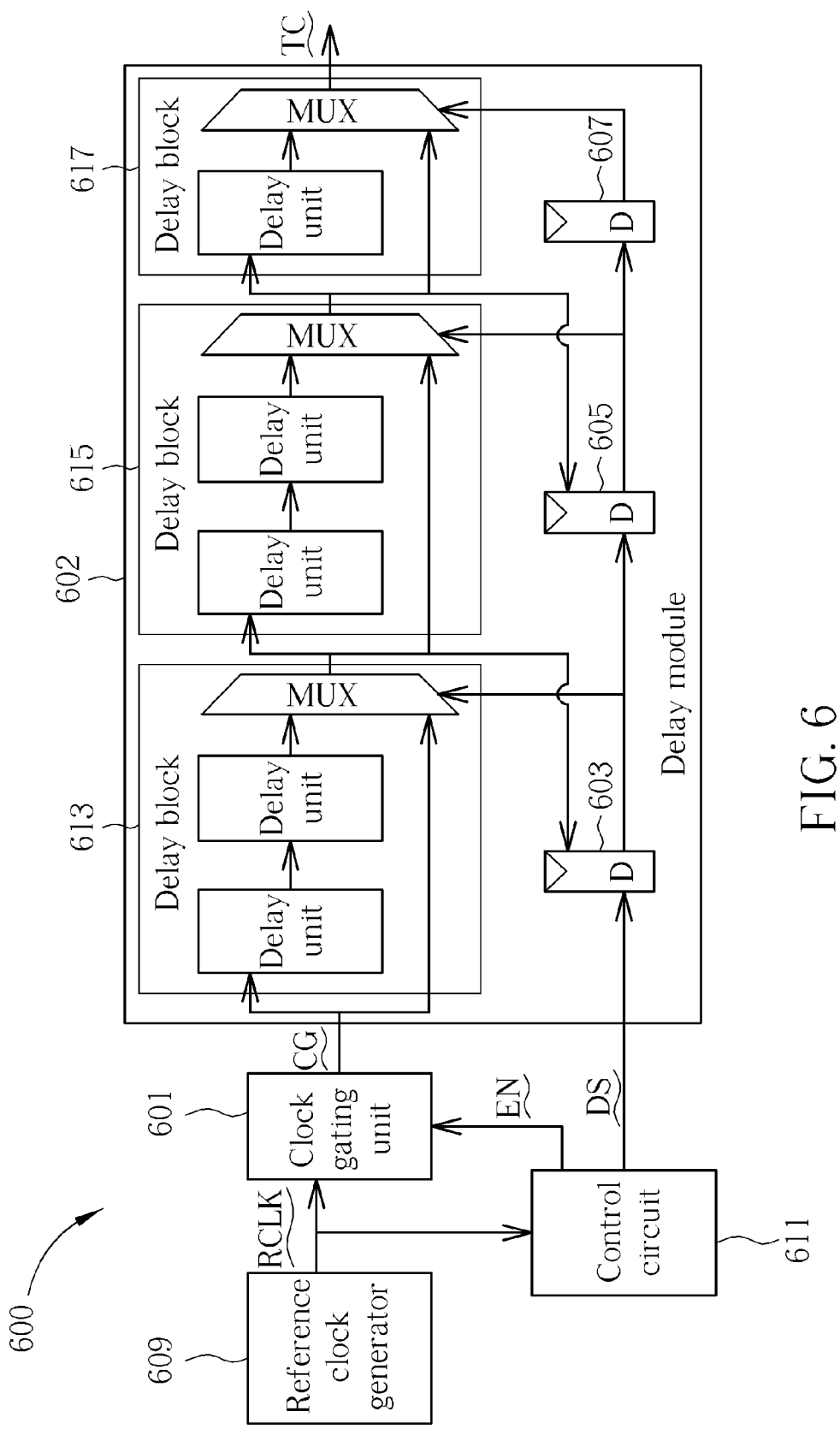
FIG. 6 is a block diagram illustrating a clock generator according to a fifth embodiment of the present invention, which is an extension of the embodiment shown in FIG. 5.

FIG. 6 is a block diagram illustrating a clock generator 600 according to a fifth embodiment of the present invention, which is an extension of the embodiment shown in FIG. 5. In the embodiment shown in FIG. 6, the registers 603, 605 and 607 in the delay module 602 still serve to register the delay selecting signal DS but are trigged by the output signal the delay selecting signal DS wants to select instead of the output signal from a previous delay block. For example, in FIG. 5 the register 505 is triggered by an output signal of the delay block 513 and the output thereof serves to select the delay block 515. However, in FIG. 6, the register 605 is triggered by an output signal of the delay block 615, which the output of the register 605 also serves to select. It should be noted that the mechanism of the clock gating and the de-skew mechanism can exist independently. That is, the clock generator can include the clock gating unit while the delay module includes no registers for de-screwing, and vice versa.

Figure 7:
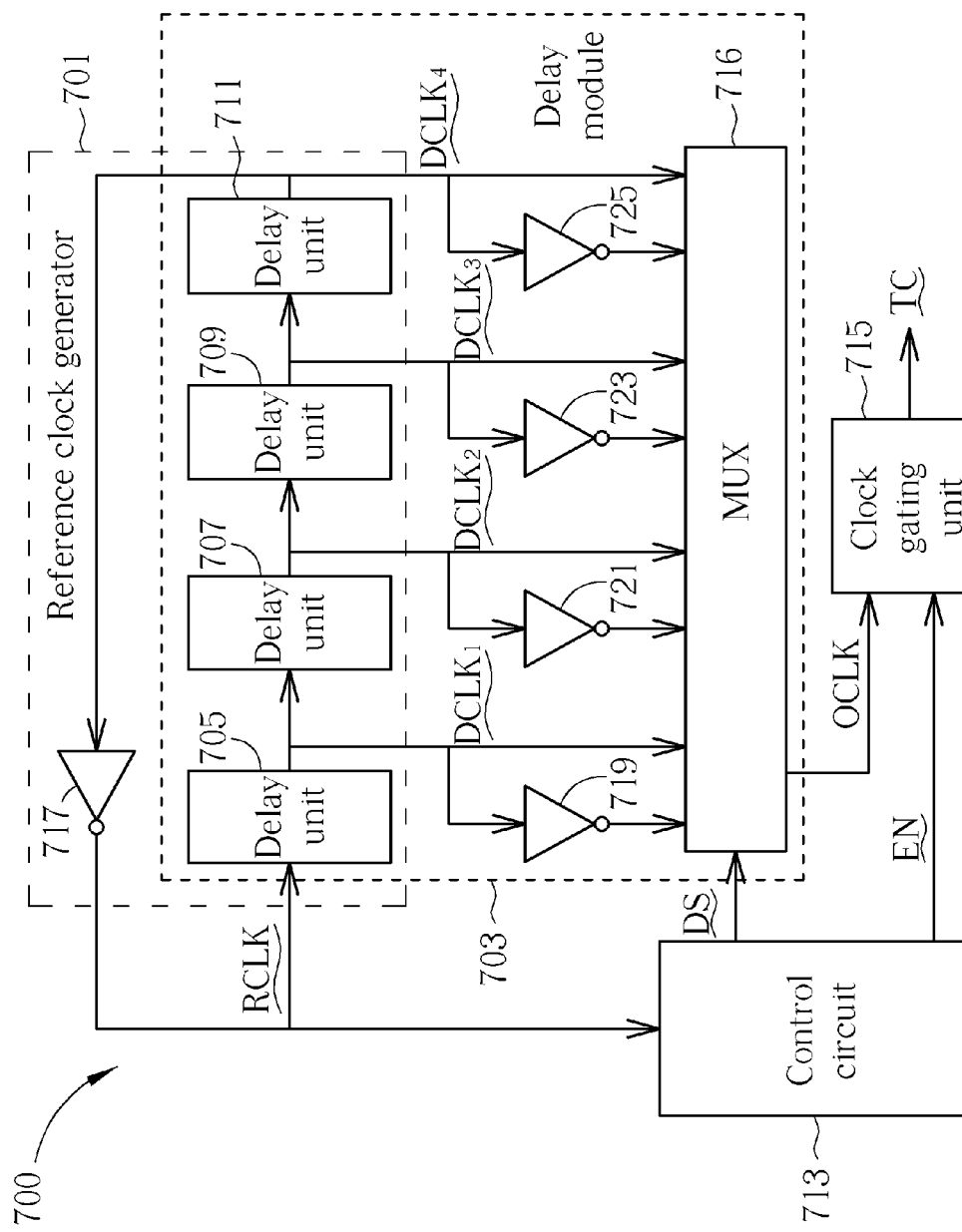
FIG. 7 is a block diagram illustrating a clock generator according to a sixth embodiment of the present invention.

FIG. 7 is a block diagram illustrating a clock generator 700 according to a sixth embodiment of the present invention. In this embodiment, the reference clock generator 701 and the delay module 703 share the delay units 705, 707, 709 and 711. Specifically, the reference clock generator 701 includes delay units 705, 707, 709 and 711, and an inverter 717. The reference clock generator 701 rings (i.e. lets a signal pass through the delay units one or more times) the delay units 705~711 to generate the reference clock RCLK. The delay module 703 utilizes at least one of the delay units 705, 707, 709 and 711 to generate the delay clock signals $DCLK_1$, $DCLK_2$, $DCLK_3$ and $DCLK_4$. The control circuit 713 serves to generate a delay selecting signal DS for selecting one of the delay clock signals $DCLK_1$, $DCLK_2$, $DCLK_3$ and $DCLK_4$ as the output clock signal OCLK. Additionally, the control circuit 713 serves to generate the enable signal EN, and the clock gating unit 715 serves to pass the output clock signal OCLK for generating the target clock signal TC according to the enable signal EN. The selector 716 can also have a plurality of registers (not shown) for de-skewing. Additionally, this embodiment is not limited to having the inverters 717, 719, 721, 723 and 725. The inverters can be omitted corresponding to different structures of the reference clock generator 701.

Figure 8:
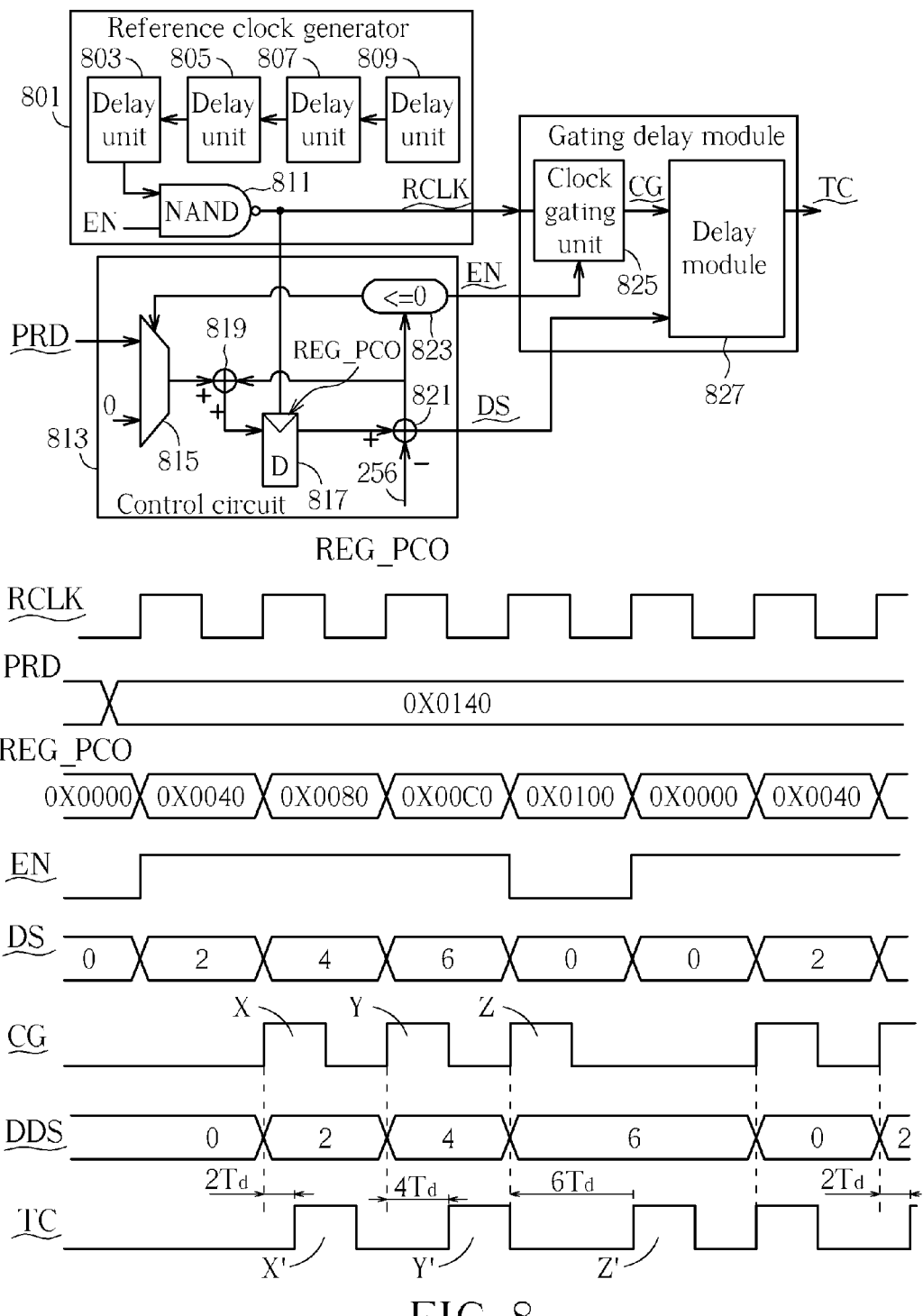
FIG. 8 is a circuit diagram illustrating the detailed structures of the reference clock generator and the control circuit according to a seventh embodiment of the present invention.

FIG. 8 is a circuit diagram illustrating the detailed structures of the reference clock generator and the control circuit according to a seventh embodiment of the present invention. As shown in FIG. 8, the reference clock generator 801 includes a plurality of delay units 803~809 having substantially the same delay amounts and a NAND gate 811. The reference clock generator 801 utilizes at least one of the delay units 803~809 to generate the reference clock signal RCLK. Thus, the period of the reference clock signal RCLK is relative to the delay amounts of the delay units 803~809. In this embodiment, if a delay time of the delay units 803~809 is Td, the period of the reference clock signal RCLK is 8Td. Also, an enable signal EN is inputted to the NAND gate 811 to control whether the reference clock signal RCLK is generated or not.

In this embodiment, the control circuit 813 includes a selector 815, a register 817, adders 819, 821 and a determining unit 823. When the input into the determining unit 823 is not larger than 0, the output from the determining unit 823 is 1. Otherwise, the determining unit 823 outputs 0. The signal PRD serves to decide the period of the target clock signal. The period of the target clock signal equals to (period of the reference clock signal)*PRD/256. And the signal REG_PCO inputted to the register 817 serves as a counter, which generate a clock signal according to the value of the signal PRD. According to the above mentioned structures, the reference signal RCLK, the enable signal EN, and the delay selecting signal DS can be generated and input to the clock gating unit 825 and the delay module 827. Additionally, the delay selecting signal DS is delayed by the registers in the delay module (the same as the registers 503, 505 and 507 shown in FIG. 5, but not shown in FIG. 8) to generate the delayed delay selecting signal DDS, and the delay units in the delay module 827 are selected according to the delayed delay selecting signal DDS. In this way, the signal parts X, Y, and Z are respectively delayed for 2Td, 4Td and 6Td to generate X', Y' and Z'.

Figure 9:
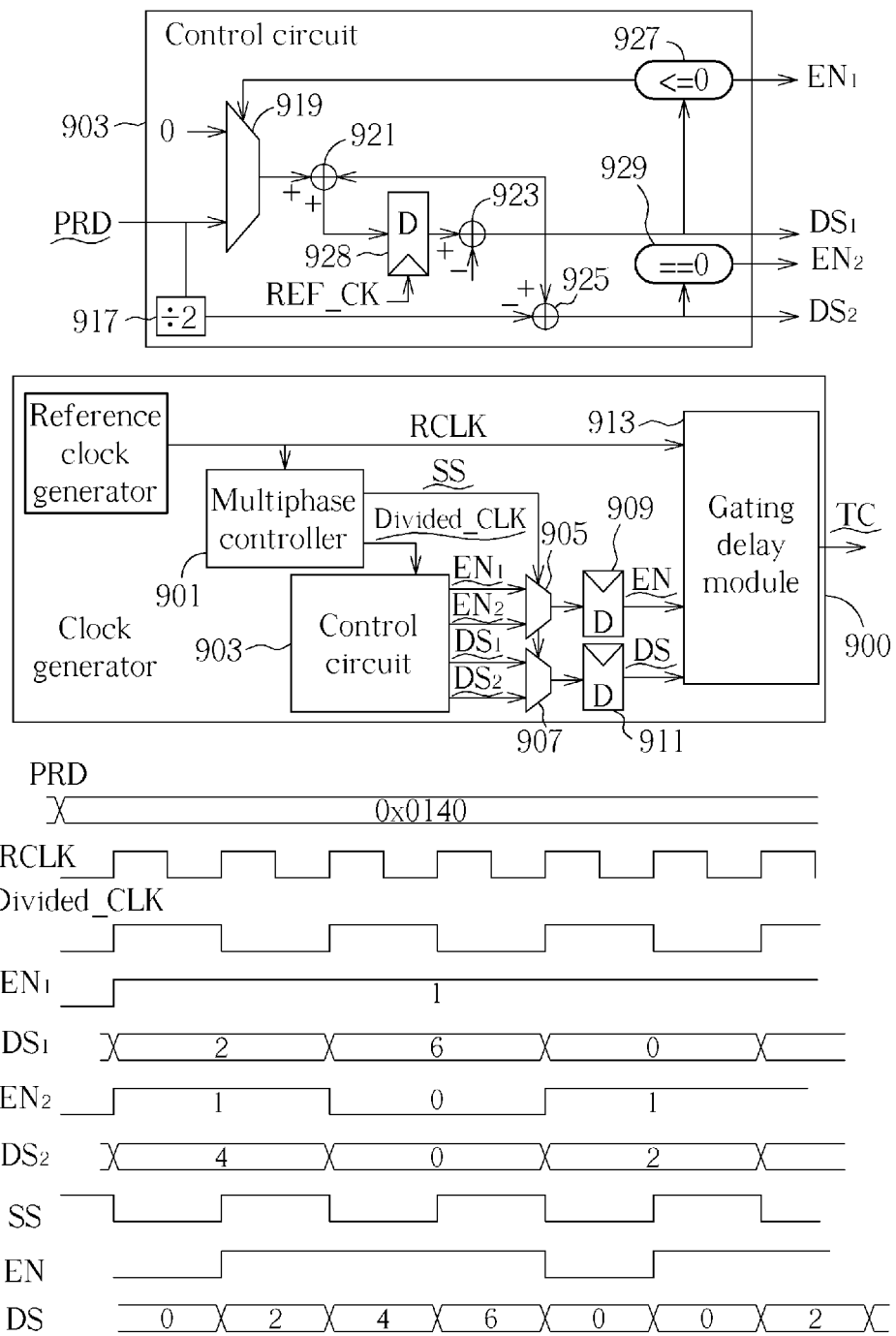
FIG. 9 is a block diagram illustrating a clock generator according to an eighth embodiment of the present invention.

FIG. 9 is a block diagram illustrating a clock generator 900 according to an eighth embodiment of the present invention. Please jointly refer to the block diagram and the signal diagram to understand this embodiment more clearly. In this embodiment, the clock generator 900 further includes a multiphase controller 901 for performing a frequency dividing operation to a reference clock signal RCLK, for generating a frequency-divided clock signal Divided_CLK, which is input to the control circuit 903. In addition, the multiphase controller 901 also generates the selecting signal SS. The control circuit 903 generates a plurality of candidate clock enable signals and $EN_1$, $EN_2$, and a plurality of candidate delay selecting signals $DS_1$, $DS_2$. The clock generator 900 further includes a plurality of selectors 905, 907 and registers 909, 911.

The selectors 905, 907 receive the selecting signal SS to select one of the candidate clock enable signals $EN_1$, $EN_2$, and one of the plurality of candidate delay selecting signals $DS_1$, $DS_2$, to output to the registers 909 and 911. The registers 909 and 911 register the output from the selectors 905, 907, and output the clock enable signal EN and the delay selecting signal DS to the gating delay module 913, which has the above-mentioned clock gating unit and the delay module. In this embodiment, the control circuit 903 includes a frequency divider 917, a selector 919, adders 921, 923, 925, a register 928, and determining units 927, 929. When the input into the determining unit 927 is not larger than 0, the output from the determining unit 927 is 1. Otherwise, the determining unit 927 outputs 0. When the input into the determining unit 929 is equal to 0, the output from the determining unit 929 is 1. Otherwise, the determining unit 929 outputs 0.

In this way, the control circuit 903 can operate at a lower frequency and provide enable signals with different phases. In the embodiment shown in FIG. 9, the number of candidate clock enable signals $EN_1$, $EN_2$, and candidate delay selecting signals $DS_1$, $DS_2$ are two, thus the timing respectively generated by the candidate clock enable signals $EN_1$, $EN_2$ and candidate delay selecting signals $DS_1$, $DS_2$ respectively have phase differences of 180 degrees from each other. Specifically, the timing generated by the clock enable signal EN1 and delay selecting signal DS1 leads the timing generated by the clock enable signal EN2 and delay selecting signal DS2 half period of the signal PRD. Additionally, the frequency divided reference clock signal Divided_RCLK has ½ the frequency of the reference clock RCLK.

Figure 10:
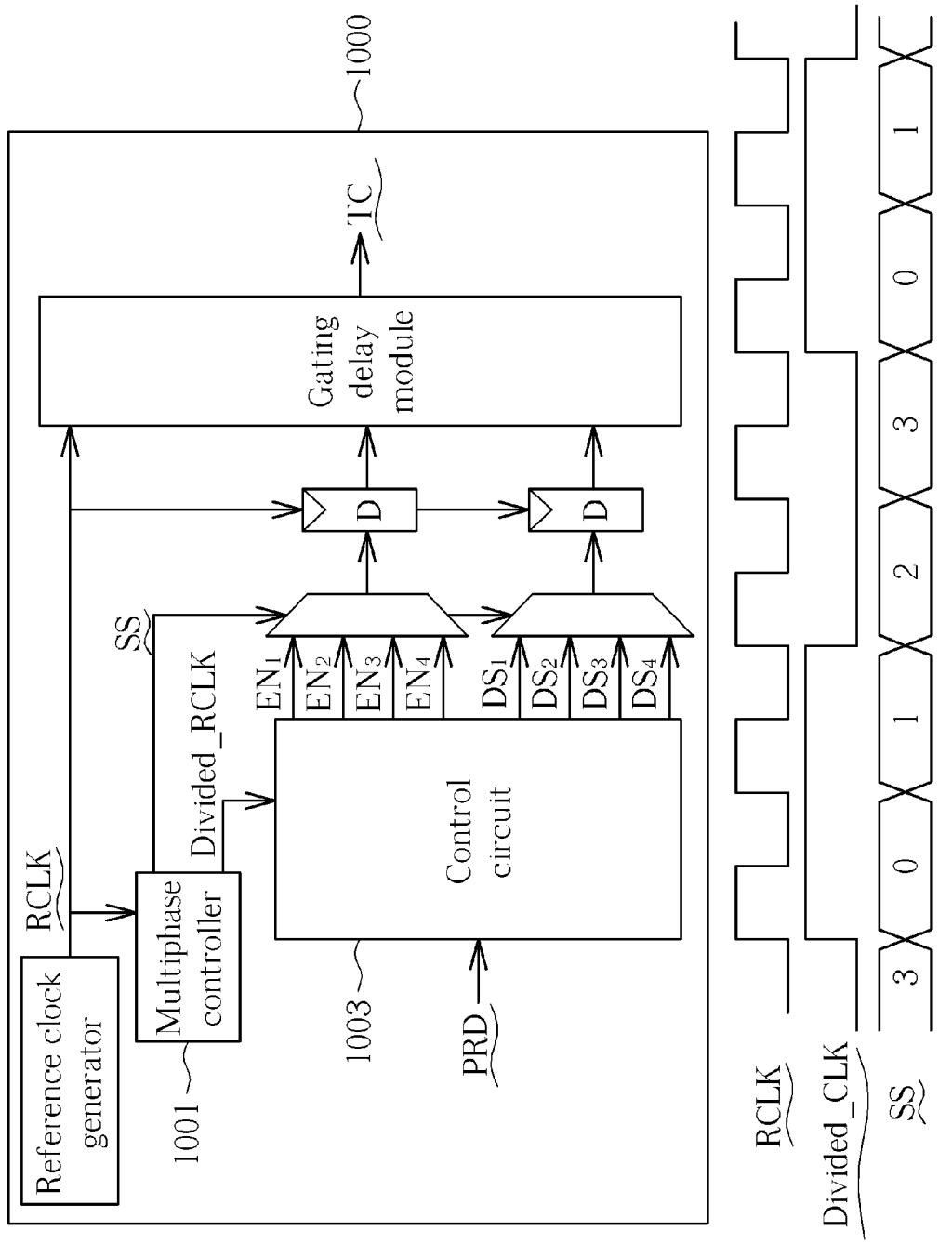
FIG. 10 is a block diagram illustrating a clock generator according to a ninth embodiment of the present invention.

The number of candidate clock enable signals $EN_1$, $EN_2$, and candidate delay selecting signals $DS_1$, $DS_2$ are not limited to two but can also be other numbers. For example, the clock generator 1000 shown in FIG. 10 divides the reference clock RCLK into a frequency divided reference clock signal Divided_RCLK having ¼ the frequency of the reference clock RCLK. Also, the control circuit 1003 generates four candidate clock enable signals $EN_1$, $EN_2$, EN3 and EN4, and four delay selecting signals $DS_1$, $DS_2$, $DS_3$ and $DS_4$. In addition, the candidate clock enable signals $EN_1$~$EN_4$ respectively have phase differences of 0 degrees, 90 degrees, 180 degrees, and 270 degrees from one of the candidate clock enable signals.

Figure 11:
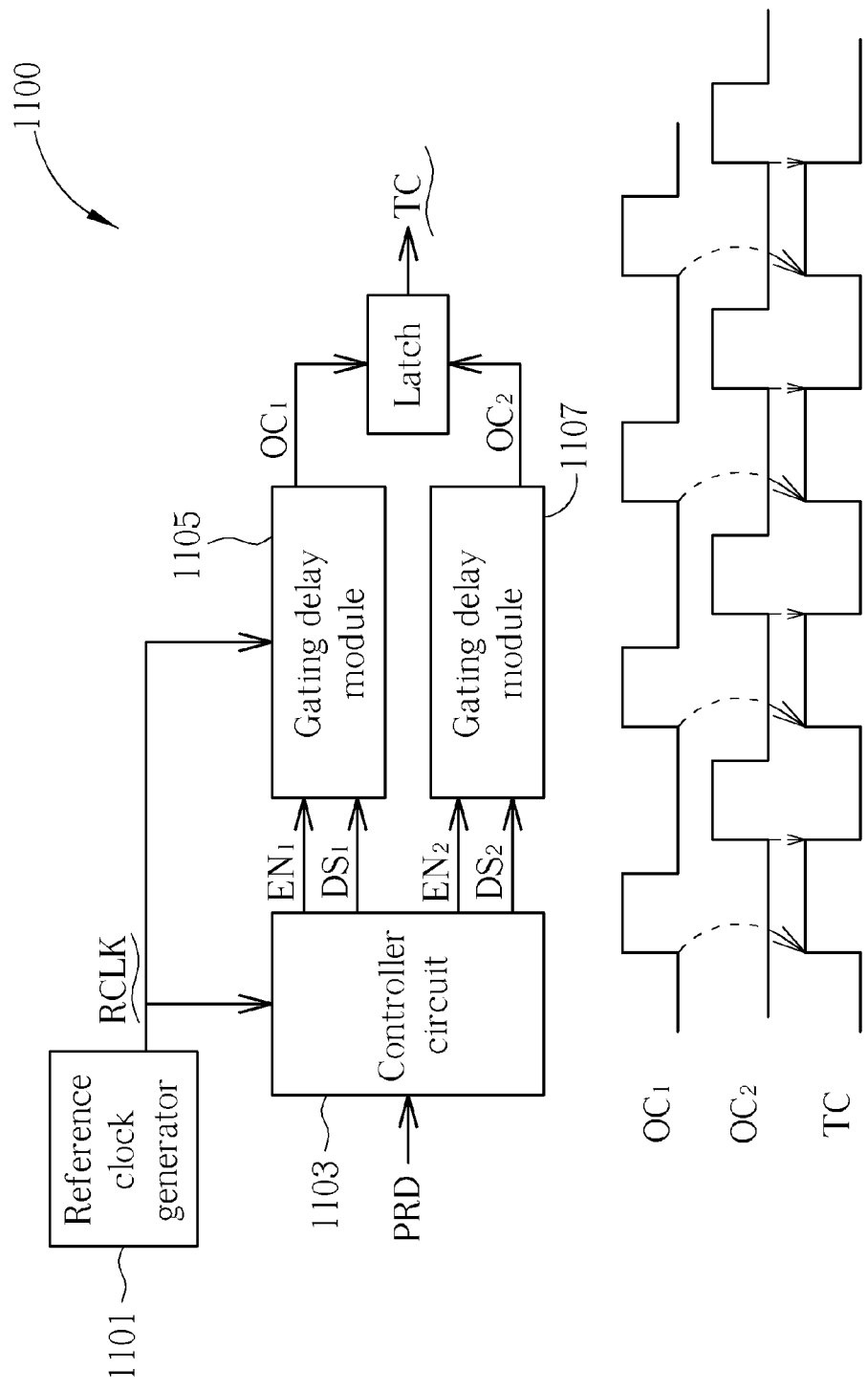
FIG. 11 is a block diagram illustrating a clock generator according to a tenth embodiment of the present invention.

FIG. 11 is a block diagram illustrating a clock generator 1100 according to a tenth embodiment of the present invention. In this embodiment, the clock generator 1100 includes two gating delay modules 1105, 1107, which respectively include the above mentioned clock gating units and delay modules. The gating delay modules 1105 and 1107 respectively receive the reference clock signal RCLK, clock enable signals $EN_1$, $EN_2$, and delay selecting signals $DS_1$, $DS_2$ to generate output signals $OC_1$ and $OC_2$. After that, the latch 1109 (an S-R latch in this embodiment) serves to generate a target signal TC according to the output signals $OC_1$ and $OC_2$. Please refer to the signal diagram illustrated in FIG. 11. A rising edge of the target clock signal TC follows a rising edge of the output signal $OC_1$, and a falling edge of the target clock signal TC follows a rising edge of the output signal OC2. In this way, a target clock signal TC having a desired duty can be obtained.

Figure 12:
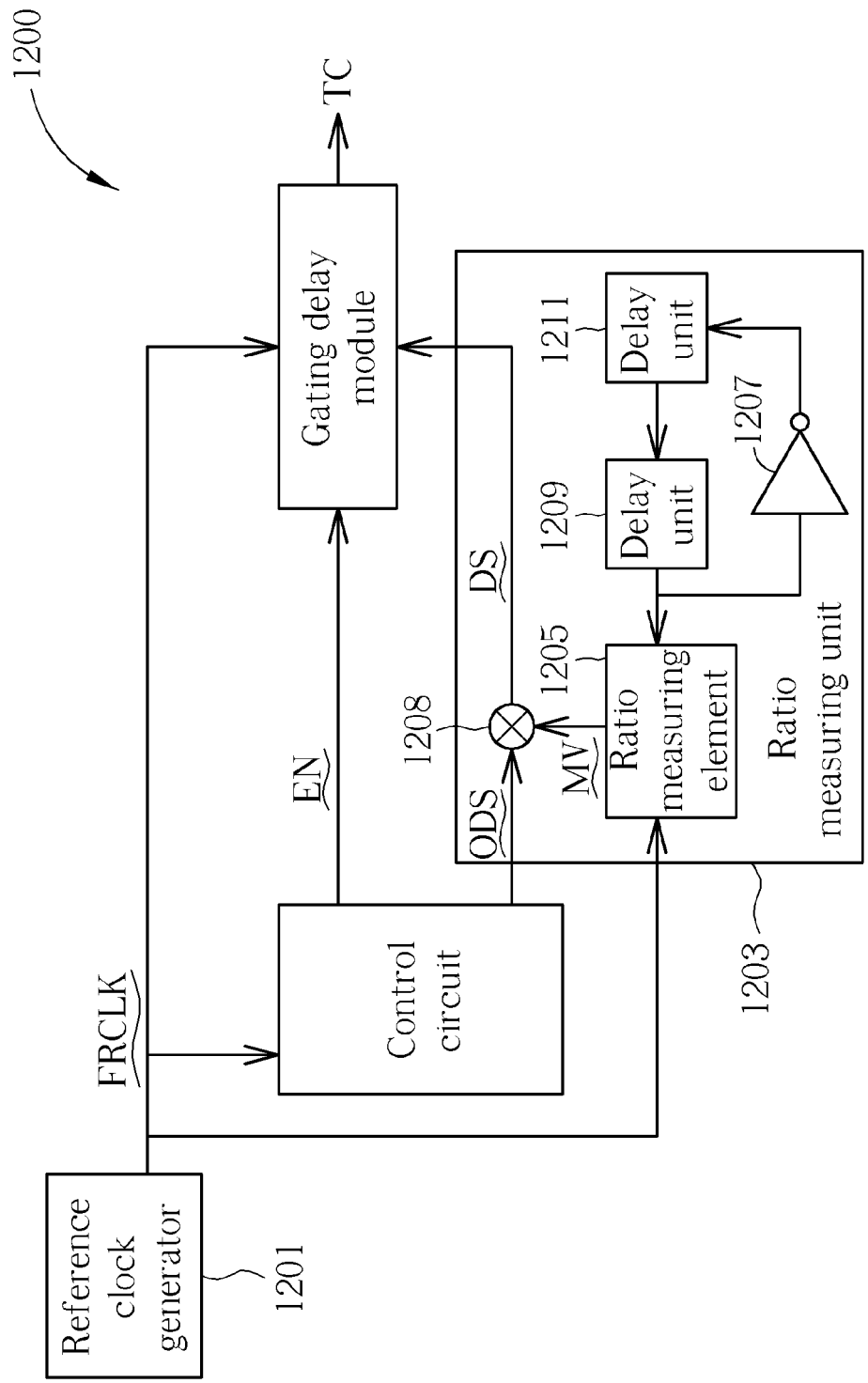
FIG. 12 is a block diagram illustrating a clock generator according to an eleventh embodiment of the present invention.

FIG. 12 is a block diagram illustrating a clock generator 1200 according to an eleventh embodiment of the present invention. In this embodiment, the reference clock generator 1201 generates a fixed reference clock signal FRCLK instead of a reference clock signal RCLK relative to delay units shown in FIG. 8. Thus, a ratio measuring unit 1203 is included in the clock generator 1200 to measure the relation between a delay amount of the delay units and the period of the fixed reference clock signal FRCLK, thereby the delay selecting signal DS can be generated according to the relations between the delay amount of the delay units and the period of the fixed reference clock signal FRCLK to delay the fixed reference clock signal FRCLK to generate the target clock signal TC. In this embodiment, the ratio measuring unit 1203 includes a ratio measuring element 1205, an inverter 1207, a multiplier 1208, and delay units 1209, 1211. The fixed reference clock signal FRCLK is input to the ratio measuring unit 1203 and ringed by the delay units 1209, 1211, and the inverter 1207, such that the relation between the delay amounts and the delay units 1209, 1211 and the period of the fixed reference clock signal FRCLK can be measured by the ratio measuring element 1205 to generate the delay relation values MV. Then, the delay relation values MV and an original delay selecting signal ODS are processed by the multiplier 1208 to generate the delay selecting signal DS.

Figure 13:
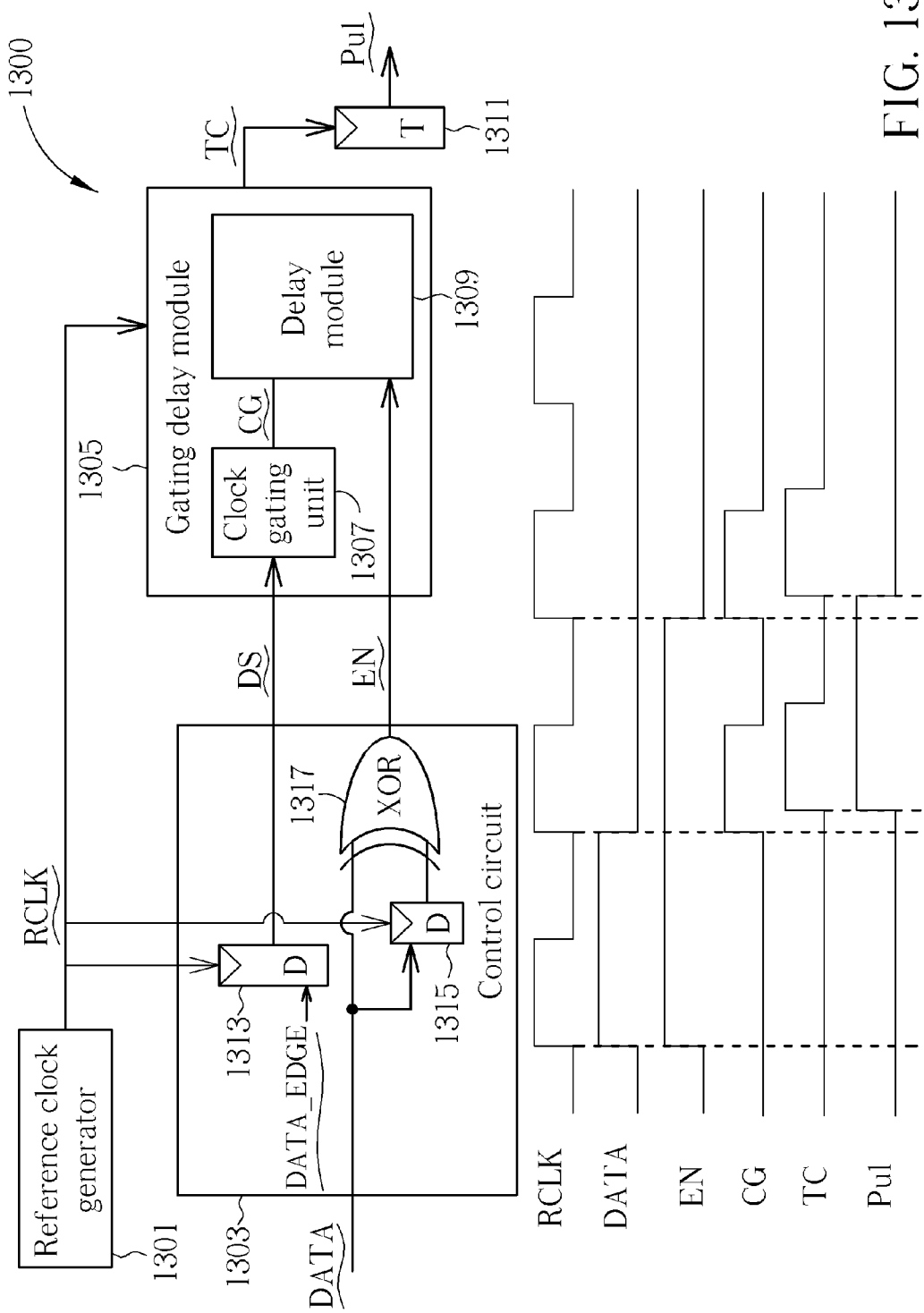
FIG. 13 is a block diagram illustrating a pulse generator utilizing a clock generator according to a further embodiment of the present invention.

FIG. 13 is a block diagram illustrating a pulse generator 1300 utilizing a clock generator according to a further embodiment of the present invention. As shown in FIG. 13, a data signal DATA is further input to the control circuit 1303 besides the reference clock signal RCLK generated from the reference clock generator 1301. The control circuit 1303 generates the clock enable signal EN and the delay selecting signal DS. Additionally, the gating delay module 1305 including a clock gating unit 1307 and the delay module 1309 generates the target clock signal TC according to the clock enable signal EN and the delay selecting signal DS. After that, a toggle flip flop 1311 serves to generate a pulse signal PUL according to the target signal TC. Here, the delay module 1309 can include a plurality of registers for de-skew mechanisms, but they are not illustrated for brevity.

Please refer to the signal diagrams also illustrated in FIG. 13. The clock enable signal EN is generated when the data signal DATA changes. The clock gating signal CG is delayed to generate the target signal TC. The width of the pulse signal Pul is determined by the edges of the target signal TC. That is, the width of the pulse signal Pul is determined by the delay selecting signal DS. The control circuit 1303 includes registers 1313, 1315 and an XOR gate 1317 but this is not meant as a limitation of the scope of the present invention. Other structures that can reach the same function should also fall within the scope of the present invention. Furthermore, the toggle flip flop 1311 can also be other edge trigger registers. Such kind of pulse generator can be utilized for a laser controller, for example, a laser controller of an optical disc driver.

For example, the pulse signal PUL can be utilized to turn on/off the laser of the optical disc driver. Besides, the pulse signal PUL can also be utilized to determine the intensity of the laser of the optical disc driver. However, please note that these two cases are only for example and do not mean to limit the scope of the present application. That is, the pulse signals PUL can be utilized to control other operations of the optical disc driver laser besides turning on/off or intensity.

Figure 14:
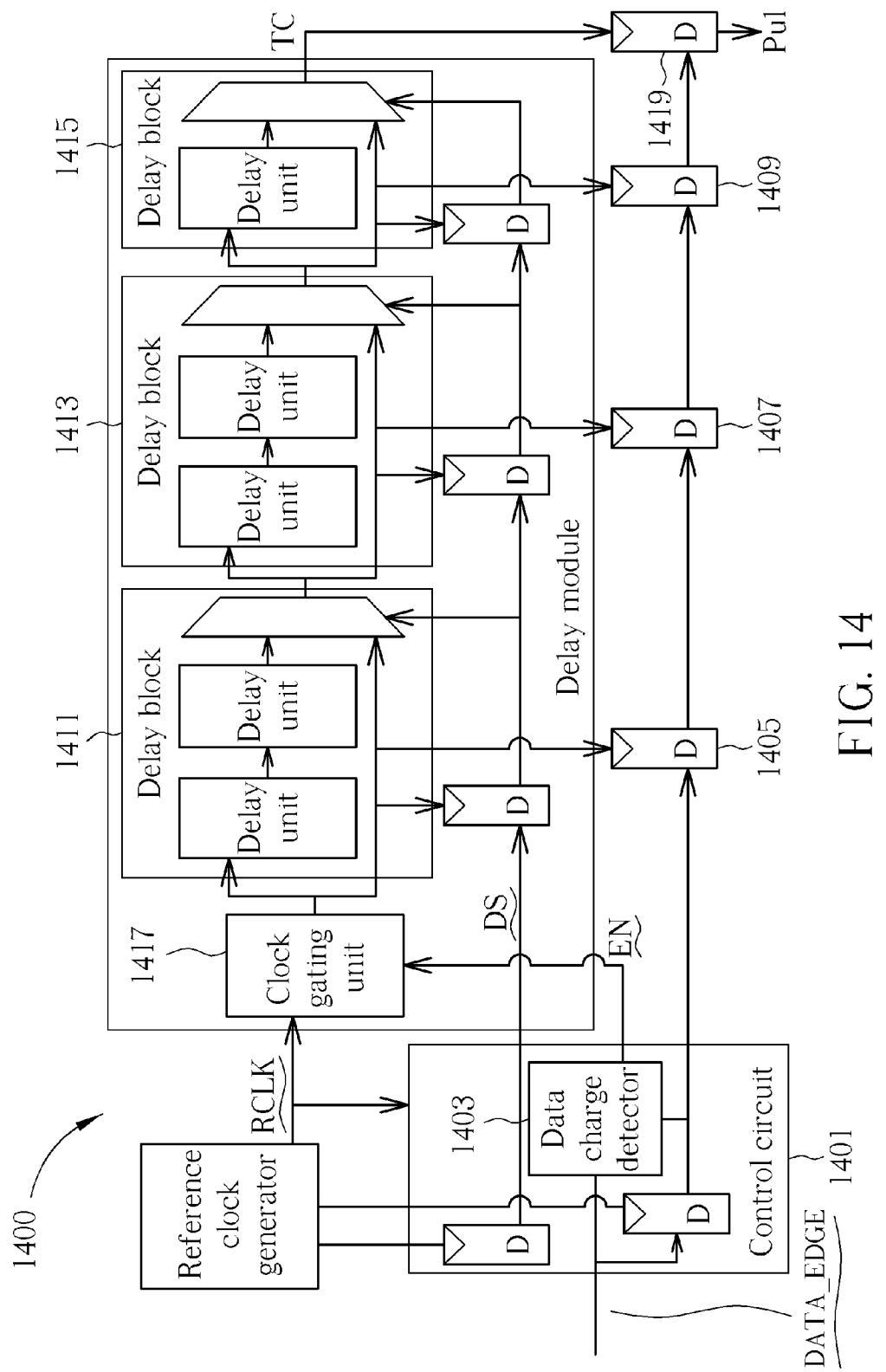
FIG. 14 is a block diagram illustrating a pulse generator utilizing a clock generator according to another embodiment of the present invention.

FIG. 14 is a block diagram illustrating a pulse generator 1400 utilizing a clock generator according to another embodiment of the present invention. The clock generator 1400 includes some different structures from the pulse generator 1300, and has some different operations accordingly. The control circuit 1401 replaces the XOR gate 1317 in FIG. 13 with a data change detector 1403. Also, the clock generator 1400 includes a plurality of registers 1405, 1407, and 1409 for registering the data signal DATA according to the output signals from the clock gating unit 1417 or delay blocks 1411, 1413. Additionally, the register 1419 outputs the registered data signal from the register 1409 according to the target signal TC, thereby a pulse signal Pul is generated.

Figure 15:
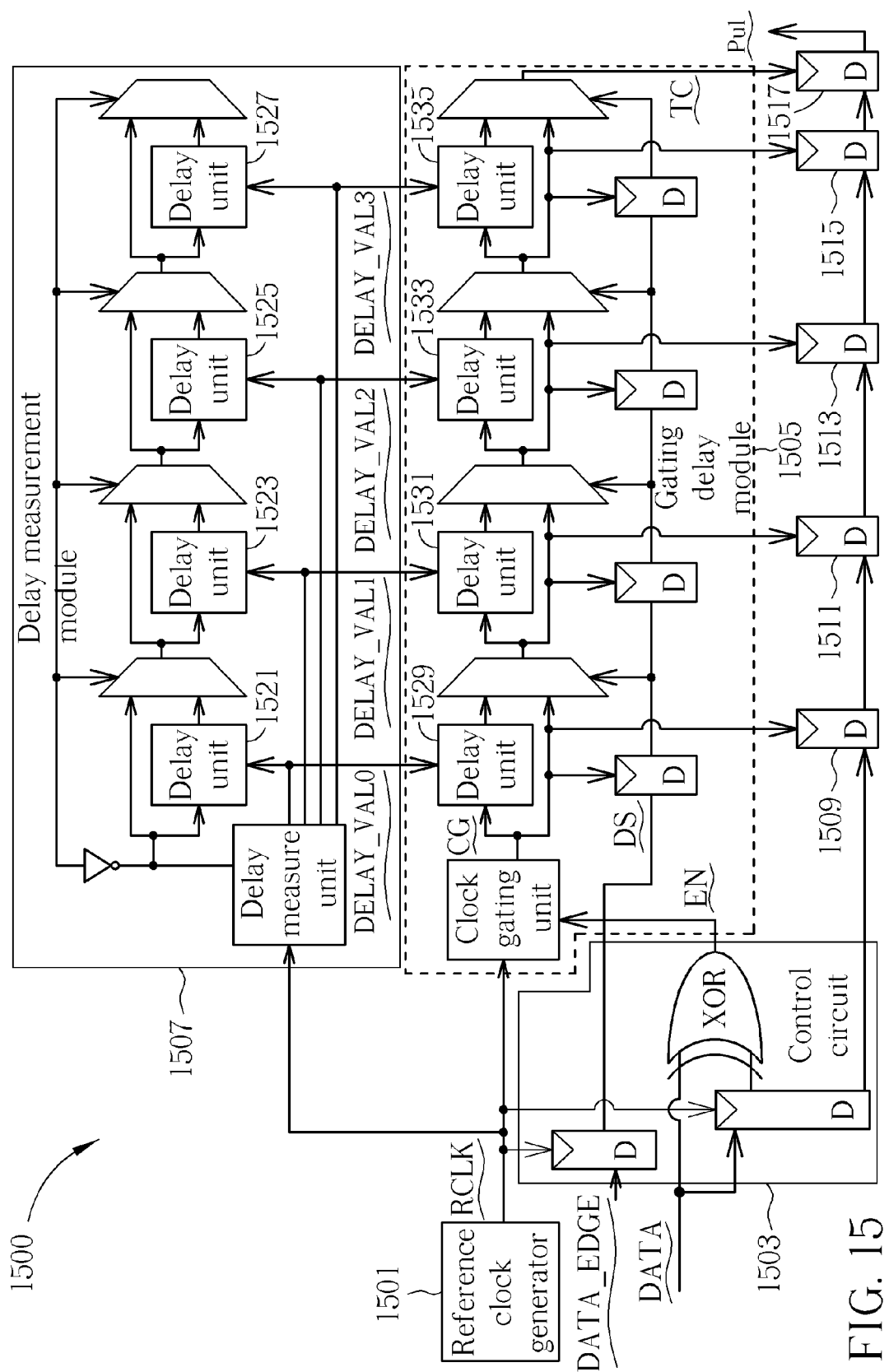
FIG. 15 is a block diagram illustrating a pulse generator utilizing a clock generator according to another embodiment of the present invention.

FIG. 15 is a block diagram illustrating a pulse generator 1500 utilizing a clock generator according to another embodiment of the present invention. Compared with the embodiment shown in FIG. 14, the pulse generator 1500 further include a delay measurement module 1507 besides the reference clock generator 1501, the control circuit 1503, the gating delay module 1505 and registers 1509~1517. The delay measurement module 1507 serves to measure the relations between the delay amounts of delay units 1521~1527 and the reference clock RCLK to generate a plurality of delay relation values DELAY_VAL0~DELAY_VAL3. The delay amounts of the delay units 1521~1527 can be adjusted such that the delay amounts thereof can be locked to a specific phase of the reference clock signal RCLK, and the delay relation values DELAY_VAL0~DELAY_VAL3 indicate the relations between the period of the reference clock signal RCLK and the delay amounts of the delay units 1521~1527. The edge signal DATA_EDGE is generated accompanied with the data signal DATA, and is utilized to determine edges of the data signal DATA while generating the pulse signal PUL. If the edge signal DATA_EDGE is processed via the register 1313, it becomes the delay selecting signal DS, as shown in FIG. 13.

Therefore, if the delay amounts of the delay units 1521~1527 are adjusted to ¼ period of the reference clock signal RCLK, the delay units 1529~1535 can receive the delay relation values DELAY_VAL0~DELAY_VAL3 such that the delay amounts of the delay units 1529~1535 are also adjusted to ¼ period of the reference clock signal RCLK. In addition, the delay amounts of the delay units 1529~1535 are not limited to be locked to ¼ period of the reference clock signal RCLK. For example, the delay amounts of the delay units 1529~1535 can have relations with the periods of the reference clock signal RCLK in a power order. For example, the delay unit 1529 may have a delay amount equal to ½ period of the reference clock signal RCLK, the delay unit 1531 has a delay amount equal to ¼ period of the reference clock signal RCLK, the delay unit 1533 has a delay amount equal to ⅛ period of the reference clock signal RCLK, and the delay unit 1535 has a delay amount equal to ¹⁄₁₆ period of the reference clock signal RCLK.

According to the embodiments shown in FIGS. 13 and 14, the width of the pulse signal PUL includes a width corresponding to the delay selection signal; that is, the width of the pulse signal PUL corresponds to the delay amount of the delay units. Therefore, the width of the pulse signal PUL can have a specific relation with the reference clock signal RCLK, since the delay amount of delay units have a specific relation with the reference clock signal RCLK.

Figure 16:
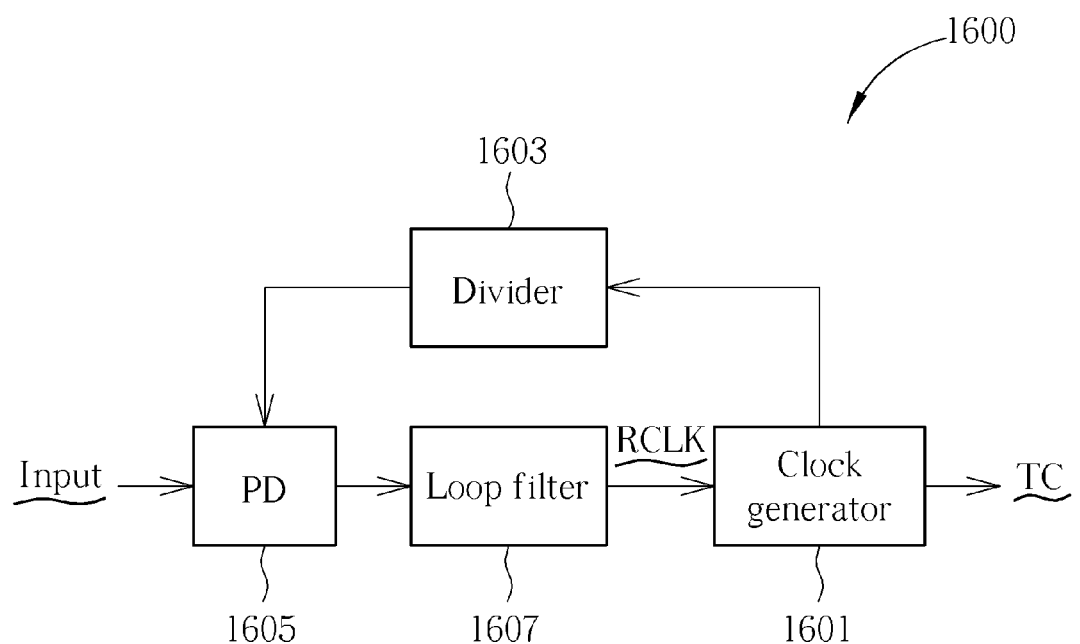
FIGS. 16~17 are block diagrams illustrating other electronic systems utilizing the clock generators according to embodiments of the present invention.
Figure 17:
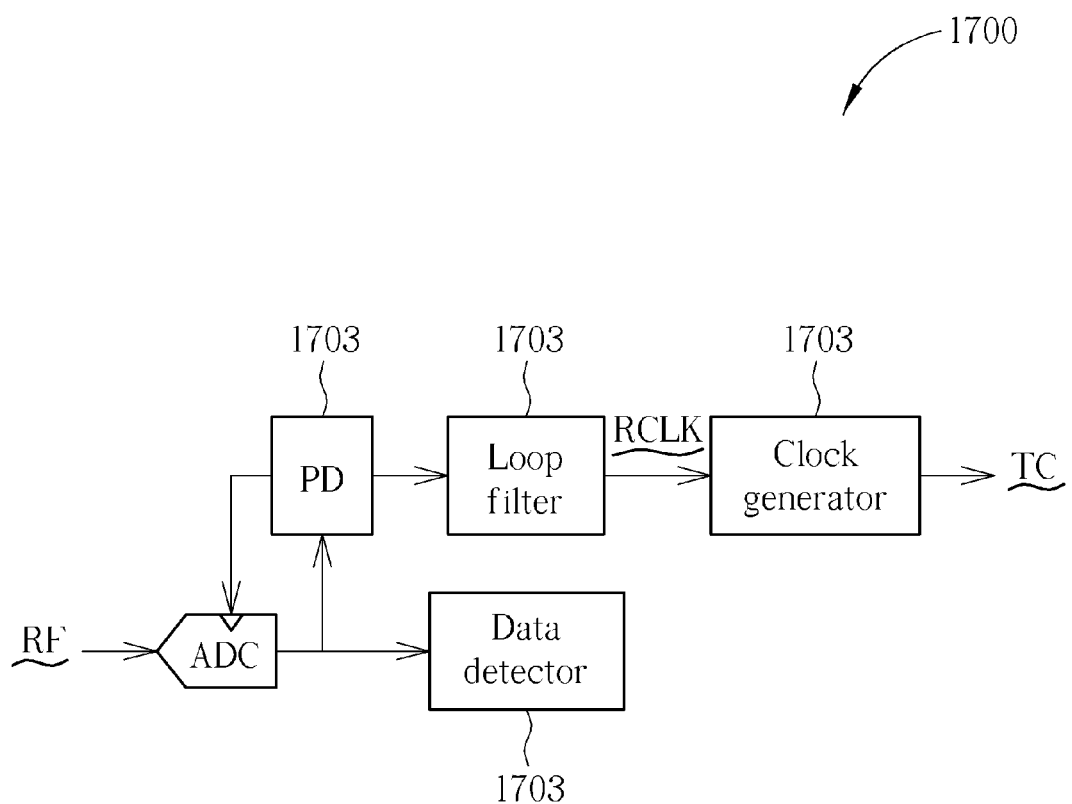

FIGS. 16~17 are block diagrams illustrating other electronic systems utilizing the clock generators according to embodiments of the present invention. FIG. 16 illustrates a PLL (phase locked loop) 1600 including a clock generator 1601 according to the present invention, a frequency divider 1603, a phase detector 1605, and a loop filter 1607. In this case, the clock generator 1601 is utilized as an oscillator. FIG. 17 illustrates a processing module 1700 provided in an optical disc driver. In this case, the clock generator 1703 generates a target signal TC to sample an RF signal RF from an optical disc. It should be noted that FIGS. 16, 17 are only examples and do not mean to limit the scope of the present invention. Other electronic systems can also utilize the clock generator according to the various embodiments of the present invention as one of the devices thereof.

Related methods can be acquired according to the above-mentioned description, and are thus omitted here for brevity.

According to the above-mentioned embodiments, a correct clock signal edge can be provided without frequency-dividing the clock signal, therefore a high frequency clock signal is no longer required. Furthermore, the delay selecting signal can be self-aligned, thus the problem of skew can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator for generating a target clock signal, comprising:
   a control circuit, receiving a reference clock signal, and for generating a clock enable signal and a delay selecting signal according to the reference clock signal;
   a delay module, coupled to the control circuit, for delaying the reference clock signal according to the delay selecting signal to generate a delayed reference clock signal; and
   a clock gating unit, coupled to the delay module and the control circuit, for receiving the delayed reference clock signal and the clock enable signal, and for passing the delayed reference clock signal according to the clock enable signal, to generate the target clock signal.

2. The clock generator of claim 1, wherein the reference clock signal is generated by a reference clock generator, the reference clock generator includes a plurality of delay units, the delay module shares at least one of the delay units of the reference clock generator, the reference clock generator utilizes at least one of the delay units to generate the reference clock signal and the delay module utilizes at least one of the delay units to generate the delayed reference clock signal according to the delay selecting signal.

3. The clock generator of claim 1, wherein the delay module includes:
   a first delay block, for delaying the reference clock signal to generate a first delayed reference clock signal;

a first register, for registering the delay selecting signal according to the first delayed reference clock signal to generate a registered delay selecting signal; and a second delay block, for delaying the first delayed reference clock signal to generate a second delayed reference clock signal according to the registered delay selecting signal.

4. A clock generating method for generating a target clock signal, comprising:

generating a clock enable signal and a delay selecting signal according to a the reference clock signal;

delaying the reference clock signal according to the delay selecting signal to generate a delayed reference clock signal;

blocking the delayed reference clock signal; and passing the delayed reference clock signal according to the clock enable signal, to generate the target clock signal.

5. The clock generating method of claim 4, further comprising:

jointly utilizing at least one delay unit to generate the reference clock and the delayed reference clock signal according to the delay selecting signal.

6. The clock generating method of claim 4, further comprising:

delaying the reference clock signal to generate a first delayed reference clock signal;

registering the delay selecting signal according to the first delayed reference clock signal to generate a registered delay selecting signal; and delaying the first delayed reference clock signal to generate a second delayed reference clock signal according to the registered delay selecting signal.

* * * * *